United States Patent
Hayashi et al.

(10) Patent No.: US 12,055,853 B2
(45) Date of Patent: Aug. 6, 2024

(54) PHOTOSENSITIVE RESIN COMPOSITION, LAMINATE, AND PATTERN FORMING PROCESS

(71) Applicant: Shin-Etsu Chemical Co., Ltd., Tokyo (JP)

(72) Inventors: Kumiko Hayashi, Annaka (JP); Michihiro Sugo, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 332 days.

(21) Appl. No.: 16/728,153

(22) Filed: Dec. 27, 2019

(65) Prior Publication Data

US 2020/0209751 A1    Jul. 2, 2020

(30) Foreign Application Priority Data

Dec. 28, 2018   (JP) ................... 2018-247071

(51) Int. Cl.
| | |
|---|---|
| G03F 7/075 | (2006.01) |
| G03F 7/16 | (2006.01) |
| G03F 7/20 | (2006.01) |
| G03F 7/30 | (2006.01) |

(52) U.S. Cl.
CPC ............ *G03F 7/0757* (2013.01); *G03F 7/162* (2013.01); *G03F 7/20* (2013.01); *G03F 7/30* (2013.01)

(58) Field of Classification Search
CPC .......... G03F 7/0757; G03F 7/162; G03F 7/20; G03F 7/30; G03F 7/091; G03F 7/0752; G03F 7/0382; G03F 7/0046; G03F 7/0397; G03F 7/40; G03F 7/0035; G03F 7/094

See application file for complete search history.

(56) References Cited

U.S. PATENT DOCUMENTS

| | | | |
|---|---|---|---|
| 6,590,010 B2 | 7/2003 | Kato et al. | |
| 8,715,905 B2 | 5/2014 | Tagami et al. | |
| 2009/0110917 A1* | 4/2009 | Albaugh | H01L 23/296 428/411.1 |
| 2009/0148789 A1* | 6/2009 | Amara | G03F 7/0752 430/326 |
| 2009/0253084 A1* | 10/2009 | Takemura | G03F 7/0397 430/326 |
| 2010/0279025 A1* | 11/2010 | Fu | G03F 7/091 427/515 |
| 2013/0196114 A1* | 8/2013 | Urano | G03F 7/0382 428/139 |
| 2015/0064904 A1* | 3/2015 | Yao | G03F 7/091 438/694 |
| 2020/0354501 A1* | 11/2020 | Makinoshima | C09D 161/18 |

FOREIGN PATENT DOCUMENTS

| | | |
|---|---|---|
| EP | 1186624 A1 | 3/2002 |
| EP | 2397508 A1 | 12/2011 |
| JP | 2002-88158 A | 3/2002 |
| JP | 2007-122029 A | 5/2007 |
| JP | 2008-20898 A | 1/2008 |
| JP | 2009-42422 A | 2/2009 |
| JP | 2012-1668 A | 1/2012 |

OTHER PUBLICATIONS

Office Action dated Oct. 5, 2021, issued in counterpart JP Application No. 2018-247071, with English Translation. (6 pages).

* cited by examiner

*Primary Examiner* — Mark F. Huff
*Assistant Examiner* — Richard David Champion
(74) *Attorney, Agent, or Firm* — WHDA, LLP

(57) ABSTRACT

A photosensitive resin composition comprising (A) a silicone skeleton-containing polymer, (B) a photoacid generator, and (C) a peroxide is coated to form a photosensitive resin coating which is unsusceptible to plastic deformation while maintaining flexibility. A pattern forming process using the composition is also provided.

10 Claims, No Drawings

PHOTOSENSITIVE RESIN COMPOSITION, LAMINATE, AND PATTERN FORMING PROCESS

CROSS-REFERENCE TO RELATED APPLICATION

This non-provisional application claims priority under 35 U.S.C. § 119(a) on Patent Application No. 2018-247071 filed in Japan on Dec. 28, 2018, the entire contents of which are hereby incorporated by reference.

TECHNICAL FIELD

This invention relates to a photosensitive resin composition, laminate, and pattern forming process.

BACKGROUND ART

In the prior art, photosensitive protective films for semiconductor chips and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition having improved flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene skeleton-containing silicone polymer. This composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in the reliability of such resin compositions is desired.

When silicone compositions are used as protective or dielectric films on semiconductor chips and as parts like optical members, they are required to have not only reliability, but also an ability to restore the original shape after release of an applied force. A material having a low percent plastic deformation is demanded to this end. However, the silicone polymer is susceptible to deformation because the silicone skeleton incorporated in the polymer takes a helical structure. The addition of fillers or organic peroxide curing agents is successful in increasing strength, but fails to maintain the flexibility of the silicone skeleton. There exists the demand for a material having a low percent plastic deformation while maintaining flexibility.

CITATION LIST

Patent Document 1: JP-A 2002-088158 (U.S. Pat. No. 6,590,010, EP 1186624) Patent Document 2: JP-A 2012-001668 (U.S. Pat. No. 8,715,905, EP 2397508)

DISCLOSURE OF INVENTION

An object of the invention is to provide a photosensitive resin composition comprising a silicone skeleton-containing polymer, capable of forming a photosensitive resin coating which is unsusceptible to plastic deformation while remaining flexible, a laminate obtained using the composition, and a pattern forming process using the composition.

The inventors have found that when a peroxide having a hydrogen abstraction ability is used in combination with a silicone skeleton-containing polymer free of vinyl in the molecule, crosslinks are formed between side chain hydrocarbons on the silicone skeleton-containing polymer, whereby siloxane skeletons are crosslinked together to prevent their helical structure from extending further. As a result, there is obtained a photosensitive resin composition which is unsusceptible to plastic deformation while maintaining silicone flexibility.

In one aspect, the invention provides a photosensitive resin composition comprising (A) a silicone skeleton-containing polymer, (B) a photoacid generator, and (C) a peroxide.

In a preferred embodiment, the silicone skeleton-containing polymer (A) comprises recurring units having the formulae (a1) to (a4) and (b1) to (b4).

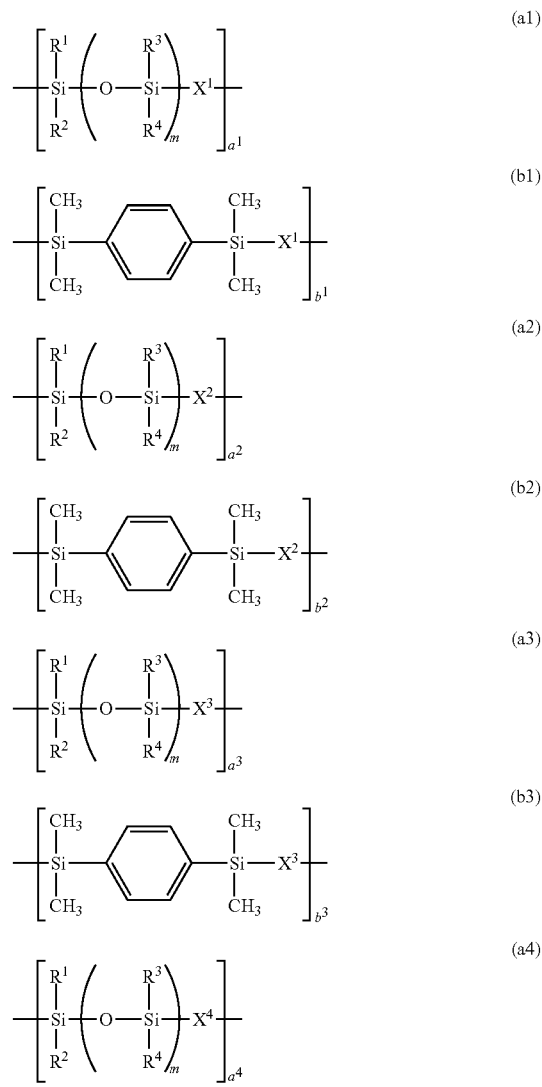

-continued

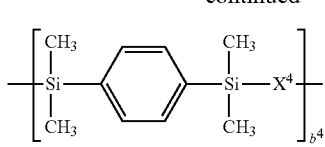
(b4)

Herein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1 + a^2 + a^3 + a^4 < 1$, $0 < b^1 + b^2 + b^3 + b^4 < 1$, and $a^1 + a^2 + a^3 + a^4 + b^1 + b^2 + b^3 + b^4 = 1$, $X^1$ is a divalent group having the following formula (X1), $X^2$ is a divalent group having the following formula (X2), $X^3$ is a divalent group having the following formula (X3), $X^4$ is a divalent group having the following formula (X4).

(X1)

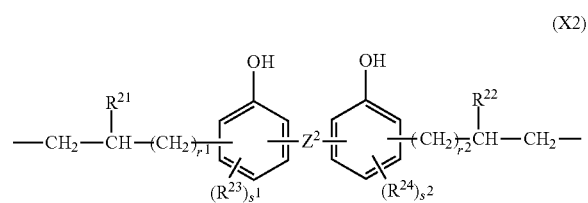

Herein $Z^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $p^1$ and $p^2$ are each independently an integer of 0 to 7, and $q^1$ and $q^2$ are each independently an integer of 0 to 2.

(X2)

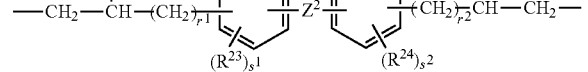

Herein $Z^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $r^1$ and $r^2$ are each independently an integer of 0 to 7, and $s^1$ and $s^2$ are each independently an integer of 0 to 2.

(X3)

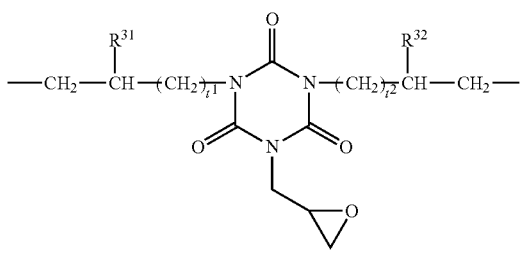

Herein $R^{31}$ and $R^{32}$ are each independently hydrogen or methyl, and $t^1$ and $t^2$ are each independently an integer of 0 to 7.

(X4)

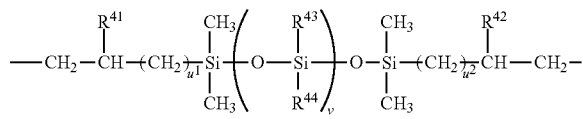

Herein $R^{41}$ and R42 are each independently hydrogen or methyl, $R^{43}$ and $R^{44}$ are each independently a $C_1$-$C_8$ monovalent hydrocarbon group, $u^1$ and $u^2$ are each independently an integer of 0 to 7, and v is an integer of 0 to 600.

Preferably, the peroxide (C) is an organic peroxide selected from the group consisting of peroxyketal, hydroperoxide, dialkyl peroxide, diacyl peroxide, peroxy ester, and peroxy dicarbonate compounds. Also preferably, the peroxide (C) is present in an amount of 0.1 to 50 parts by weight per 100 parts by weight of the silicone skeleton-containing polymer (A).

The composition may further comprise (D) a crosslinker, (E) a solvent, and/or (F) a quencher.

In another aspect, the invention provides a laminate comprising a substrate having grooves and/or holes having an opening width of 10 to 100 μm and a depth of 10 to 120 μm and a photosensitive resin coating formed thereon from the photosensitive resin composition defined above.

In a further aspect, the invention provides a pattern forming process comprising the steps of:
 (i) applying the photosensitive resin composition defined above to form a photosensitive resin coating on a substrate,
 (ii) exposing the photosensitive resin coating to radiation,
 (iii) developing the exposed resin coating in a developer, and optionally
 (iv) post-curing the patterned resin coating resulting from development step (iii) at a temperature of 100 to 250° C.

Typically, the substrate has grooves and/or holes having an opening width of 10 to 100 μm and a depth of 10 to 120 μm.

ADVANTAGEOUS EFFECTS OF INVENTION

The photosensitive resin composition is easy to form a coating. The photosensitive resin coating has improved properties including light resistance, microprocessing ability, reliability (in terms of adhesion and crack resistance), resolution and flexibility.

DESCRIPTION OF PREFERRED EMBODIMENT

As used herein, the notation (Cn-Cm) means a group containing from n to m carbon atoms per group.

Photosensitive Resin Composition

One embodiment of the invention is a photosensitive resin composition comprising (A) a silicone skeleton-containing polymer, (B) a photoacid generator, and (C) a peroxide.

(A) Silicone Skeleton-Containing Polymer

Component (A) is a silicone skeleton-containing polymer. Preferably, the silicone skeleton-containing polymer (A)

comprises recurring units having the formulae (a1) to (a4) and (b1) to (b4). For simplicity sake, the recurring units are also referred to as recurring units (a1) to (a4) and (b1) to (b4), respectively.

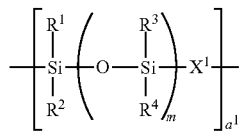
(a1)

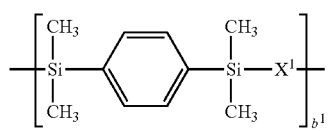
(b1)

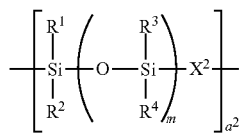
(a2)

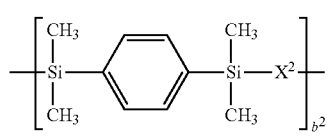
(b2)

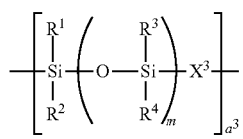
(a3)

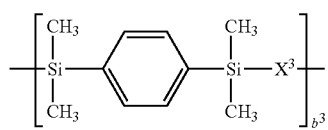
(b3)

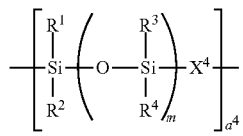
(a4)

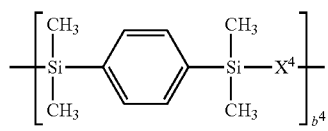
(b4)

In formulae (a1) to (a4), $R^1$ to $R^4$ are each independently a $C_1$-$C_8$ monovalent hydrocarbon group, and m is an integer of 1 to 600. When m is an integer of at least 2, groups $R^3$ may be identical or different, and groups $R^4$ may be identical or different. In the repeating units (a1) to (a4), where at least two siloxane units are included, the siloxane units may be all identical, or at least two different siloxane units may be included. Where at least two different siloxane units are included (i.e., m is an integer of at least 2), the siloxane units may be bonded either randomly or alternately, or a plurality of blocks each consisting of identical siloxane units may be included.

The monovalent hydrocarbon groups may be straight, branched or cyclic. Examples include alkyl groups such as methyl, ethyl, propyl, hexyl, cyclohexyl and structural isomers thereof, and aryl groups such as phenyl. Of these, methyl and phenyl are preferred because of availability of reactants.

In formulae (a1) to (a4), m is an integer of 1 to 600, preferably 1 to 400, more preferably 1 to 200.

In formulae (a1) and (b1), $X^1$ is a divalent group having the formula (X1).

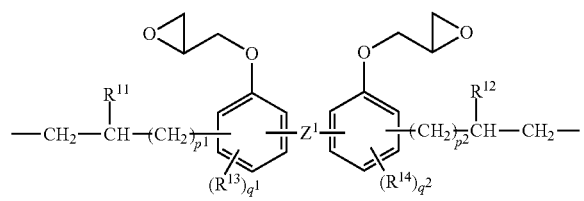
(X1)

In formula (X1), $Z^1$ is a single bond, methylene, propane-2,2-diyl, 1,1,1,3,3,3-hexafluoropropane-2,2-diyl or fluorene-9,9-diyl. $R^{11}$ and $R^{12}$ are each independently hydrogen or methyl, $R^{13}$ and $R^{14}$ are each independently a $C_1$-$C_4$ alkyl group or $C_1$-$C_4$ alkoxy group, $p^1$ and $p^2$ are each independently an integer of 0 to 7, and $q^1$ and $q^2$ are each independently an integer of 0 to 2.

The alkyl group may be straight, branched or cyclic, and examples thereof include methyl, ethyl, propyl, butyl, and structural isomers thereof. The alkoxy group may be straight, branched or cyclic, and examples thereof include methoxy, ethoxy, propoxy, butoxy, and structural isomers.

In formulae (a2) and (b2), $X^2$ is a divalent group having the formula (X2).

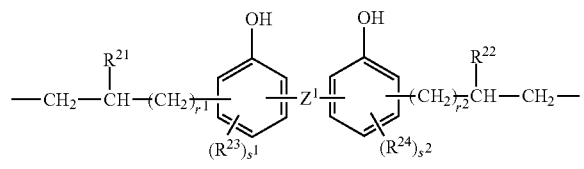
(X2)

In formula (X2), $Z^2$ is a single bond, methylene, propane-2,2-diyl, 1,1,1,3,3,3-hexafluoropropane-2,2-diyl or fluorene-9,9-diyl. $R^{21}$ and $R^{22}$ are each independently hydrogen or methyl. $R^{23}$ and $R^{24}$ are each independently a $C_1$-$C_4$ alkyl group or $C_1$-$C_4$ alkoxy group, $r^1$ and $r^2$ are each independently an integer of 0 to 7, and $s^1$ and $s^2$ are each independently an integer of 0, 1 or 2. Examples of the alkyl or alkoxy group are as exemplified above.

In formulae (a3) and (b3), $X^3$ is a divalent group having the formula (X3).

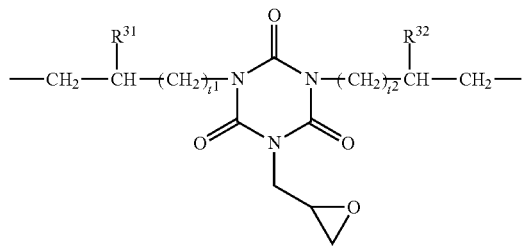

In formula (X3), $R^{31}$ and $R^{32}$ are each independently hydrogen or methyl, and $t^1$ and $t^2$ are each independently an integer of 0 to 7.

In formulae (a4) and (b4), $X^4$ is a divalent group having the formula (X4).

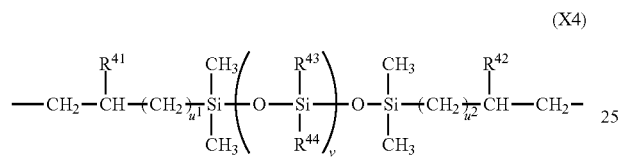

In formula (X4), $R^{41}$ and $R^{42}$ are each independently hydrogen or methyl. $R^{43}$ and $R^{44}$ are each independently a $C_1$-$C_8$ monovalent hydrocarbon group, and $u^1$ and $u^2$ are each independently an integer of 0 to 7. The subscript v is an integer of 0 to 600, preferably 0 to 400, more preferably 0 to 200. Examples of the monovalent hydrocarbon group are as exemplified above for $R^1$ to $R^4$. In formula (X4), when v is an integer of at least 2, siloxane units with subscript v may be bonded either randomly or alternately, or a plurality of blocks each consisting of identical siloxane units may be included.

The silicone skeleton-containing polymer (A) has crosslinking groups such as epoxy and hydroxyl groups or crosslinking reaction-susceptible reactive sites in the molecule.

The silicone skeleton-containing polymer (A) preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the eluent.

The subscripts $a^1$ to $a^4$ and $b^1$ to $b^4$ are numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1+a^2+a^3+a^4 < 1$, $0 < b^1+b^2+b^3+b^4 < 1$, and $a^1+a^2+a^3+a^4+b^1+b^2+b^3+b^4 = 1$, preferably in the range: $0 \le a^1 \le 0.8$, $0 \le a^2 \le 0.8$, $0 \le a^3 \le 0.8$, $0 \le a^4 \le 0.8$, $0 \le b^1 \le 0.95$, $0 \le b^2 \le 0.95$, $0 \le b^3 \le 0.95$, $0 \le b^4 \le 0.95$, $0.05 \le a^1+a^2+a^3+a^4 \le 0.8$, $0.2 \le b^1+b^2+b^3+b^4 \le 0.95$, and $a^1+a^2+a^3+a^4+b^1+b^2+b^3+b^4 = 1$, more preferably in the range: $0 \le a^1 \le 0.7$, $0 \le a^2 \le 0.7$, $0 \le a^3 \le 0.7$, $0 \le a^4 \le 0.7$, $0 \le b^1 \le 0.9$, $0 \le b^2 \le 0.9$, $0 \le b^3 \le 0.9$, $0 \le b^4 \le 0.9$, $0.1 \le a^1+a^2+a^3+a^4 \le 0.7$, $0.3 \le b^1+b^2+b^3+b^4 \le 0.9$, and $a^1+a^2+a^3+a^4+b^1+b^2+b^3+b^4 = 1$.

In the polymer, recurring units may be bonded randomly or blockwise (to form a block copolymer). In each recurring unit, siloxane units may be bonded randomly or plural blocks each consisting of siloxane units of the same type may be included. The polymer preferably has a silicone (siloxane unit) content of 30 to 80% by weight.

The silicone skeleton-containing polymer (A) exerts a sufficient film-forming function in the photosensitive resin composition. A photosensitive resin coating obtained from the composition has improved adhesion to substrates and the like, a pattern forming ability, crack resistance, and heat resistance.

The silicone skeleton-containing polymer may be used alone or in admixture of two or more as component (A).

Preparation of Silicone Skeleton-Containing Polymer

The silicone skeleton-containing polymer may be prepared by addition polymerization of a compound having the formula (1), a compound having the formula (2), and at least one compound selected from a compound having the formula (3), a compound having the formula (4), a compound having the formula (5), and a compound having the formula (6), all shown below, in the presence of a metal catalyst. These compounds are also referred to as compounds (1) to (6), respectively.

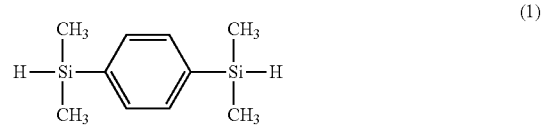

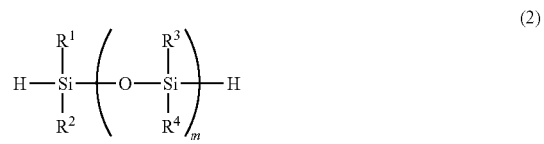

Herein $R^1$ to $R^4$ and m are as defined above.

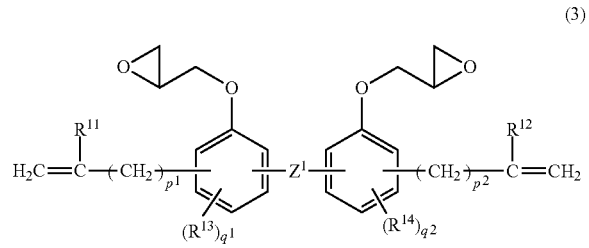

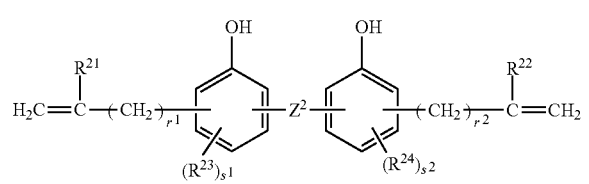

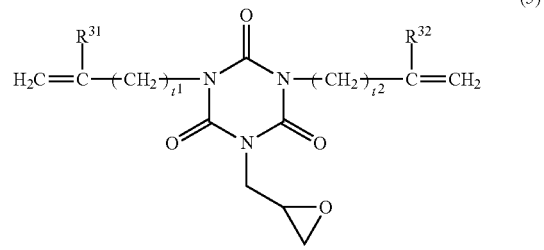

-continued (6)

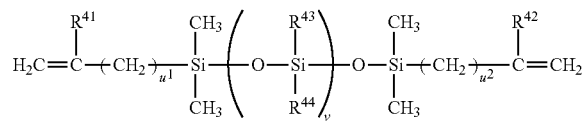

Herein RH to R¹⁴, R²¹ to R²⁴, R³¹, R³², R⁴¹ to R⁴⁴, Z¹, Z², p¹, p², q¹, q², r¹, r², S¹, s², t¹, t², u¹, u² and v are as defined above.

Examples of the metal catalyst used herein include platinum group metals alone such as platinum (including platinum black), rhodium and palladium; platinum chlorides, chloroplatinic acids and chloroplatinates such as H₂PtCl₄.xH₂O, H₂PtCl₆.xH₂O, NaHPtCl₆.xH₂O, KHPtCl₆.xH₂O, Na₂PtCl₆.xH₂O, K₂PtCl₄.xH₂O, PtCl₄.xH₂O, PtCl₂ and Na₂HptCl₄.xH₂O, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight, more preferably 0.01 to 0.1% by weight of platinum group metal based on the total weight of compounds (1) to (6).

In the polymerization reaction, a solvent may be used if desired. Suitable solvents are hydrocarbon solvents such as toluene and xylene. With respect to polymerization conditions, the polymerization temperature is preferably selected in a range of 40 to 150° C., more preferably 60 to 120° C., such that the catalyst may not be deactivated and the polymerization be completed within a short time. While the polymerization time varies with the type and amount of monomers, the polymerization reaction is preferably completed within about 0.5 to about 100 hours, more preferably about 0.5 to about 30 hours for preventing moisture entry into the polymerization system. After the completion of polymerization reaction, the solvent if any is distilled off, obtaining the desired polymer.

The reaction procedure is not particularly limited. The preferred procedure is by first heating one or more compounds selected from compounds (3) to (6), adding a metal catalyst thereto, and then adding compounds (1) and (2) dropwise over 0.1 to 5 hours.

The reactants are preferably combined in such amounts that a molar ratio of the total of hydrosilyl groups on compounds (1) and (2) to the total of alkenyl groups on compounds (3) to (6) may range from 0.67/1 to 1.67/1, more preferably from 0.83/1 to 1.25/1. The Mw of the polymer may be controlled using a molecular weight control agent such as a monoallyl compound (e.g., o-allylphenol), monohydrosilane (e.g., triethylhydrosilane) or monohydrosiloxane.

(B) Photoacid Generator

The photoacid generator (PAG) as component (B) is typically a compound which is decomposed to generate an acid upon exposure to light, preferably of wavelength 190 to 500 nm. Since the photosensitive resin composition of the invention is highly compatible with the PAG, the PAG may be selected from a wide variety of such compounds.

The PAG (B) serves as a curing catalyst. Suitable PAGs include onium salts, diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, iminosulfonate derivatives, and triazine derivatives.

Exemplary onium salts include sulfonium salts having the formula (B1) and iodonium salts having the formula (B2).

In formulae (B1) and (B2), $R^{101}$ to $R^{105}$ are each independently an optionally substituted $C_1$-$C_{12}$ alkyl group, an optionally substituted $C_6$-$C_{12}$ aryl group, or an optionally substituted $C_7$-$C_{12}$ aralkyl group. A⁻ is a non-nucleophilic counter ion. The alkyl groups may be straight, branched or cyclic and include, for example, methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl and adamantyl. The aryl groups include phenyl, naphthyl and biphenylyl. The aralkyl groups include benzyl and phenethyl. Suitable substituents on these groups include oxo, straight, branched or cyclic $C_1$-$C_{12}$ alkoxy, straight, branched or cyclic $C_1$-$C_{12}$ alkyl, $C_6$-$C_{24}$ aryl, $C_7$-$C_{25}$ aralkyl, $C_6$-$C_{24}$ aryloxy, and $C_6$-$C_{24}$ arylthio groups.

Preferred examples of $R^{101}$ to $R^{105}$ include optionally substituted alkyl groups such as methyl, ethyl, propyl, butyl, cyclohexyl, norbornyl, adamantyl and 2-oxocyclohexyl; optionally substituted aryl groups such as phenyl, naphthyl, biphenylyl, o-, m- or p-methoxyphenyl, ethoxyphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyl, oxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion represented by A⁻ include halide ions such as chloride and bromide; fluoroalkkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Exemplary diazomethane derivatives include compounds having the formula (B3).

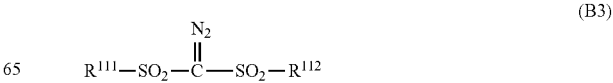

In formula (B3), $R^{111}$ and $R^{112}$ are each independently a $C_1$-$C_{12}$ alkyl or haloalkyl group, an optionally substituted $C_6$-$C_{12}$ aryl group, or a $C_7$-$C_{12}$ aralkyl group.

The alkyl group may be straight, branched or cyclic and examples thereof are as exemplified above for $R^{101}$ to $R^{105}$. Examples of the haloalkyl group include trifluoromethyl, 1,1,1-trifluoroethyl, 1,1,1-trichloroethyl, and nonafluorobutyl. Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Examples of the aralkyl group include benzyl and phenethyl.

Exemplary glyoxime derivatives include compounds having the formula (B4).

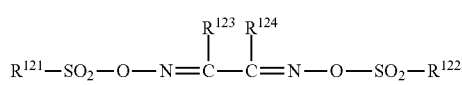
(B4)

In formula (B4), $R^{121}$ to $R^{124}$ are each independently a $C_1$-$C_{12}$ alkyl or haloalkyl group, an optionally substituted $C_6$-$C_{12}$ aryl group, or a $C_7$-$C_{12}$ aralkyl group. $R^{123}$ and $R^{124}$ may bond together to form a ring with the carbon atoms to which they are attached. In the case of ring formation, $R^{123}$ bonds with $R^{124}$ to form a $C_1$-$C_{12}$ straight or branched alkylene group.

Examples of the alkyl, haloalkyl, optionally substituted aryl and aralkyl groups are as exemplified above for $R^{111}$ and $R^{112}$. Examples of the straight or branched alkylene group include methylene, ethylene, propylene, butylene, and hexylene.

Examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl) sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl (2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)-methide, triphenylsulfonium tetrakis(fluorophenyl)borate, tris[4-(4-acetylphenyl]thiophenyllsulfonium tetrakis(fluorophenyl)borate, triphenylsulfonium tetrakis(pentafluorophenyl)borate, and tris[4-(4-acetylphenyl]thiophenyllsulfonium tetrakis (pentafluorophenyl)borate.

Examples of the diazomethane derivatives include bis (benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-pentylsulfonyl)diazomethane, bis (isopentylsulfonyl)diazomethane, bis(sec-pentylsulfonyl) diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1, 1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imidoyl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Typical of the oxime sulfonate derivative is α-(benzenesulfoniumoxyimino)-4-methylphenylacetonitrile.

Examples of the iminosulfonate derivatives include (5-(4-methylphenyOsulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile.

Also useful is 2-methyl-2-[(4-methylphenyl)sulfonyl]-1-[(4-methylthio)phenyl]-1-propane.

As the PAG, the onium salts are preferred, with the sulfonium salts being more preferred.

Preferably the PAG (B) is used in an amount of 0.05 to 20 parts by weight, more preferably 0.1 to 5 parts by weight per 100 parts by weight of component (A). When the amount of PAG is at least 0.05 part, the risk that the amount of generated acid is too short for crosslinking reaction to take place is avoided. When the amount of PAG is up to 20 parts, it is possible to prevent the acid generator itself from increasing its light absorbance, and any loss of transparency is avoided.

(C) Peroxide

Component (C) is a peroxide which serves as a crosslinker other than the reactive group on polymer side chain. The preferred peroxide is an organic peroxide. Suitable organic peroxides include peroxyketals such as 1,1-di(tert-butylperoxy)-3,3,5-trimethylcyclohexane, n-butyl-4,4-di(tert-butylperoxy)butyrate, 1,1-di(tert-pentylperoxy)-3,3,5-trimethylcyclohexane, hydroperoxides such as 1,1,3,3-tetramethylbutylhydroperoxide and tert-butylhydroperoxide, dialkyl peroxides such as dicumyl peroxide, di-tert-butyl peroxide, and 2,5-dimethyl-2,5-di(tert-butylperoxy)hexyne-3, diacyl peroxides such as diisononanoyl peroxide, dilauroyl peroxide, and dibenzoyl peroxide, alkyl peroxy esters such as tert-butyl peroxyneodecanoate, tert-butyl peroxypivalate, tert-butyl peroxy 2-ethylhexanoate, tert-butyl peroxybenzoate, tert-pentyl peroxyneodecanoate, and tert-pentyl peroxyacetate, monoperoxy carbonates such as tert-butylperoxy isopropyl carbonate and tert-pentylperoxy 2-ethylhexyl carbonate, peroxy dicarbonates such as di(2-ethylhexyl)peroxy dicarbonate, 1,6-bis(4-tert-butylperoxycarbonyloxy)hexane, and bis(4-tert-butylcyclohexyl)peroxy dicarbonate, and benzoyl peroxide. Of these, peroxy ketals, dialkyl peroxides, and peroxy esters having a relatively high decomposition temperature are preferred for ease of handling and shelf stability. These organic peroxides may be diluted with any organic solvents, hydrocarbons, liquid paraffins or inert solids, prior to use.

Component (C) is preferably used in an amount of 0.1 to 50 parts by weight, more preferably 1 to 20 parts by weight per 100 parts by weight of component (A). An amount of component (C) in the range ensures improvements in heat resistance and adhesion.

(D) Crosslinker

Preferably the photosensitive resin composition further comprises (D) a crosslinker. The crosslinker undergoes condensation reaction with phenolic hydroxyl groups or alkoxy groups represented by $R^{13}$, $R^{14}$, $R^{23}$ or $R^{24}$ on component (A) for thereby facilitating pattern formation and increasing the strength of the cured composition.

The preferred crosslinker is a resin having a Mw of 150 to 10,000, more preferably 200 to 3,000. A resin with a Mw of at least 150 is photocurable whereas a resin with a Mw of up to 10,000 may not adversely affect the heat resistance of the cured composition.

Preferably, the crosslinker is selected from nitrogen-containing compounds such as melamine, guanamine, glycoluril and urea compounds, having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

The preferred melamine compound has the formula (D1).

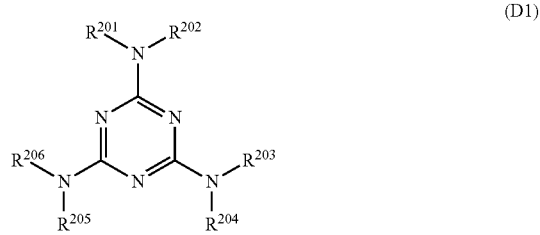

(D1)

In formula (D1), $R^{201}$ to $R^{206}$ are each independently methylol, $C_2$-$C_5$ alkoxymethyl, or hydrogen, at least one of $R^{201}$ to $R^{206}$ being methylol or alkoxymethyl. Exemplary of the alkoxymethyl group are methoxymethyl and ethoxymethyl.

Suitable melamine compounds having formula (D1) include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

The melamine compound having formula (D1) may be prepared by modifying a melamine monomer with formaldehyde into a methylol form according to a well-known technique, and optionally further modifying it with an alcohol into an alkoxy form. The alcohol used herein is preferably selected from lower alcohols, specifically alcohols of 1 to 4 carbon atoms.

Suitable guanamine compounds include tetramethylolguanamine, tetramethoxymethylguanamine and tetramethoxyethylguanamine.

Suitable glycoluril compounds include tetramethylolglycoluril and tetrakis(methoxymethyl)glycoluril.

Suitable urea compounds include tetramethylolurea, tetramethoxymethylurea, tetramethoxyethylurea, tetraethoxymethylurea, and tetrapropoxymethylurea.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a melamine having formula (D1) or an oligomer (e.g., dimer or trimer) thereof with formaldehyde until a desired molecular weight is reached. The addition polycondensation may be performed by any prior art well-known methods.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethyl groups in the molecule include (2-hydroxy-5-methyl)-1,3-benzenedimethanol and 2,2',6,6'-tetramethoxymethylbisphenol A.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

When used, component (D) is preferably added in an amount of 0.5 to 50 parts, and more preferably 1 to 30 parts by weight per 100 parts by weight of component (A). At least 0.5 part of component (D) ensures sufficient cure upon light exposure. As long as the amount of component (D) is up to 50 parts, the proportion of component (A) in the resin composition is not reduced, allowing the cured composition to exert its effects to the full extent. The crosslinkers may be used alone or in admixture.

(E) Solvent

To the photosensitive resin composition, (E) a solvent may be added. The solvent (E) used herein is not particularly limited as long as the foregoing components and other additives are dissolvable therein.

Preferred solvents are organic solvents because the components are effectively dissolvable. Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in combinations of two or more.

Of these solvents, preferred are ethyl lactate, cyclohexanone, cyclopentanone, PGMEA, γ-butyrolactone, and mixtures thereof, in which the PAG is most soluble.

When the solvent is used, it is preferred from the standpoints of compatibility and viscosity of the resin composition that the solvent (E) be added in an amount of 50 to 2,000 parts, more preferably 50 to 1,000 parts, and especially 50 to 100 parts by weight per 100 parts by weight of components (A) and (B) combined.

(F) Quencher

The photosensitive resin composition may further contain (F) a quencher. The quencher used herein is preferably a compound capable of suppressing the rate of diffusion when the acid generated by the PAG diffuses within the resin coating. The inclusion of the quencher improves resolution, suppresses changes in sensitivity following exposure and reduces substrate and environment dependence, as well as improving the exposure latitude and the pattern profile.

Examples of the quencher include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-penylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), to imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methyl-2-pyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Compounds of the formula (F1) are also useful as the quencher.

(F1)

In formula (F1), w is 1, 2 or 3; $R^{301}$ is selected from substituent groups of the following formulas (F2) to (F4), $R^{302}$ is hydrogen or a $C_1$-$C_{20}$ alkyl group which may contain an ether bond or hydroxyl moiety. Where two or three $R^{301}$ are present, two $R^{301}$ may bond together to form a ring with the nitrogen atom to which they are attached. Where two or three $R^{301}$ are present, they may be the same or different. Where two $R^{302}$ are present, they may be the same or different.

(F2)

(F3)

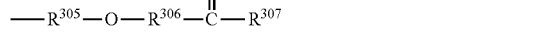

(F4)

In formulae (F2) to (F4), $R^{303}$, $R^{305}$ and $R^{308}$ are each independently a straight or branched $C_1$-$C_4$ alkanediyl group. $R^{304}$ and $R^{307}$ are each independently hydrogen, a $C_1$-$C_{20}$ alkyl group which may contain at least one hydroxyl moiety, ether bond, ester bond or lactone ring. $R^{306}$ is a single bond or a straight or branched $C_1$-$C_4$ alkanediyl group. $R^{309}$ is a $C_1$-$C_{20}$ alkyl group which may contain at least one hydroxyl moiety, ether bond, ester bond or lactone ring.

Examples of the compound of formula (F1) include tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris [2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbony)ethyl]amine, N-(2-acetoxyethyl)bis[2-(methoxycarbony)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Component (F) may be formulated in an amount of 0 to 3 parts by weight per 100 parts by weight of component (A). When used, component (F) is preferably added from the standpoint of sensitivity in an amount of 0.01 to 2 parts by weight, and especially 0.05 to 1 part by weight, per 100 parts by weight of component (A). Component (F) may be used alone or in admixture.

Other Additives

Besides the aforementioned components, the photosensitive resin composition may contain other additives, for example, surfactants which are commonly used for improving coating properties, and silane coupling agents.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. When used, the amount of the surfactant is preferably 0.01 to 5 parts by weight per 100 parts by weight of component (A).

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. The amount of the silane coupling agent used is not particularly limited as long as the benefits of the invention are not impaired. When used, the amount of the silane coupling agent is preferably 0.01 to 5% by weight of the resin composition.

The photosensitive resin composition of the invention is prepared in any conventional way. For example, it may be prepared by agitating and mixing the aforementioned components and optionally passing the mixture through a filter to remove solids.

The photosensitive resin composition is advantageously used, for example, as a film-forming material for semiconductor device protective film, interconnection protective film, coverlay film, solder mask, and TSV dielectric film, and an adhesive between substrates in three-dimensional laminates.

Pattern Forming Process

Another embodiment of the invention is a pattern forming process using the photosensitive resin composition defined above, the process comprising the steps of:

(i) applying the photosensitive resin composition to form a photosensitive resin coating on a substrate, (ii) exposing the photosensitive resin coating to radiation, and (iii) developing the exposed resin coating in a developer.

In step (i), the photosensitive resin composition is typically coated onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 µm and a depth of 10 to 120 µm.

The coating technique may be any well-known technique, for example, dipping, spin coating, or roll coating. The coating weight may be selected as appropriate for a particular purpose, preferably so as to form a photosensitive resin coating having a thickness of 0.1 to 200 µm, more preferably 1 to 150 µm.

A pre-wetting technique of dispensing a solvent dropwise on a substrate prior to coating of the resin composition may be employed for the purpose of making the coating thickness on the substrate more uniform. The type and amount of the solvent dispensed dropwise may be selected for a particular purpose. For example, alcohols such as isopropyl alcohol (IPA), ketones such as cyclohexanone, and glycols such as PGME are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation to define exposed and unexposed regions. The exposure radiation is preferably of wavelength 1 to 600 nm, more preferably 10 to 600 nm, even more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

The next step may be post-exposure bake (PEB) which is effective for enhancing development sensitivity. PEB is preferably performed at 40 to 150° C. for 0.5 to 10 minutes. The exposed region of the resin coating is crosslinked during PEB to form an insolubilized pattern which is insoluble in an organic solvent as developer.

The exposure or PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as PGME. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. The post-cure is effective for increasing the crosslinking density of the resin coating and removing any residual volatile matter. The resulting coating has augmented adhesion to substrates, heat resistance, mechanical strength, good electric properties, and bond strength. A post-cure temperature in the range of 100 to 250° C. is preferred for acquiring the above properties. The post-cure time is preferably 10 minutes to 10 hours, more preferably 10 minutes to 3 hours. The resin coating as post-cured has a thickness of 1 to 200 µm, preferably 5 to 50 µm.

Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

Substrate Bonding Method

The photosensitive resin composition may be used as an adhesive (or substrate bonding material) for bonding two substrates. The substrate bonding method may be a method of joining a first substrate having a coating of the resin composition formed thereon to a second substrate under a sufficient set of temperature and pressure conditions to form an adhesive bond between the substrates. One or both of the first substrate having a resin coating and the second substrate may have been cut into a chip such as by dicing. The preferred bonding conditions include a temperature of 50 to 200° C. and a time of 1 to 60 minutes. Any desired bonding units may be used, for example, a wafer bonder for bonding wafers under reduced pressure and under a certain load, or a flip chip bonder for performing chip-wafer or chip-chip bonding. The adhesive layer between substrates may be subjected to post-cure treatment into a permanent bond having augmented bond strength.

The thus joined or bonded substrates may be post-cured under the same conditions as in the above step (iv), for thereby increasing the crosslinking density of the resin coating to enhance substrate bonding force. It is noted that crosslinking reaction occurs by the heat during bonding. Since this crosslinking reaction is not accompanied with side reaction entailing degassing, no bonding voids are induced when the photosensitive resin composition is used as the substrate adhesive.

Laminate

A still further embodiment of the invention is a laminate comprising a substrate and a photosensitive resin coating formed thereon from the photosensitive resin composition. The substrate is a rugged substrate provided with grooves and/or holes having an opening width of 10 to 100 μm and a depth of 10 to 120 μm. Now that the photosensitive resin coating is formed from the photosensitive resin composition, the laminate is improved in adhesion between the substrate and the resin coating and provides high flatness even when the substrate is rugged.

EXAMPLES

Examples of the invention are given below by way of illustration and not by way of limitation. Notably, the weight average molecular weight (Mw) is measured by gel permeation chromatography (GPC) versus monodisperse polystyrene standards using GPC column TSKGEL Super HZM-H (Tosoh Corp.) under analytical conditions: flow rate 0.6 mL/min, tetrahydrofuran elute, and column temperature 40° C. On $^1$H-NMR spectroscopy, an analyzer by Bruker Corp. was used. All parts are by weight (pbw).

Compounds (S-1) to (S-6) used in Synthesis Examples are shown below.

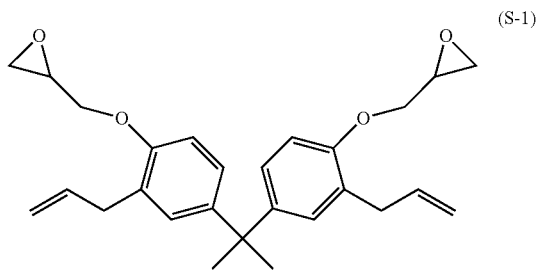

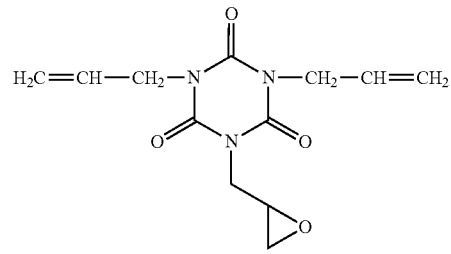

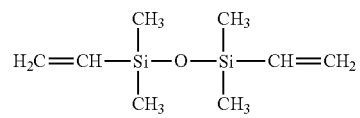

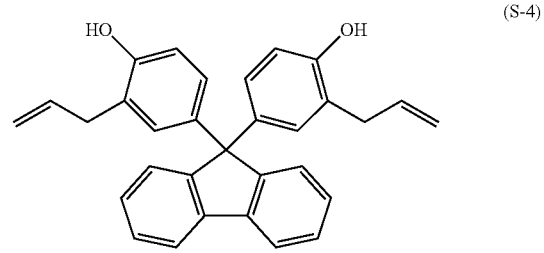

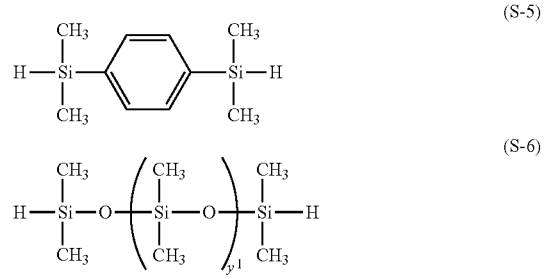

[1] Synthesis of Silicone Resins

Synthesis Example 1

Synthesis of Resin 1

A 3-L flask equipped with a stirrer, thermometer, nitrogen purge line and reflux condenser was charged with 63.0 g (0.15 mol) of Compound (S-1), 119.2 g (0.45 mol) of Compound (S-2), 18.6 g (0.10 mol) of Compound (S-3), and 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 553.4 g (0.20 mol) of Compound (S-6) wherein $y^1$=38 were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 1. On $^1$H-NMR spectroscopy analysis, Resin 1 was found to contain recurring units (a1), (b1), (a3), (b3), (a4) and (b4). Resin 1 had a Mw of 38,000 and a silicone content of 70.4 wt%.

Synthesis Example 2

Synthesis of Resin 2

A 3-L flask equipped with a stirrer, thermometer, nitrogen purge line and reflux condenser was charged with 106.0 g (0.40 mol) of Compound (S-2), 64.5 g (0.15 mol) of Compound (S-4), 9.3 g (0.05 mol) of Compound (S-3), and 2,000 g of toluene, and heated at 70° C. Thereafter, 1.0 g of a toluene solution of chloroplatinic acid (platinum concentration 0.5 wt %) was added, and 9.7 g (0.05 mol) of Compound (S-5) and 276.7 g (0.45 mol) of Compound (S-6) wherein $y^1=8$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 2. On $^1$H-NMR spectroscopy analysis, Resin 2 was found to contain recurring units (a2), (b2), (a3), (b3), (a4) and (b4). Resin 2 had a Mw of 36,000 and a silicone content of 61.3 wt%.

Synthesis Example 3

Synthesis of Resin 3

A 3-L flask equipped with a stirrer, thermometer, nitrogen purge line and reflux condenser was charged with 84.0 g (0.20 mol) of Compound (S-1), 53.0 g (0.20 mol) of Compound (S-2), 43.0 g (0.10 mol) of Compound (S-4), and 2,000 g of toluene, and heated at 70° C. Thereafter, 1.0 g of a toluene solution of chloroplatinic acid (platinum concentration 0.5 wt %) was added, and 38.8 g (0.20 mol) of Compound (S-5) and 184.5 g (0.3 mol) of Compound (S-6) wherein $y^1=8$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 3. On $^1$H-NMR spectroscopy analysis, Resin 3 was found to contain recurring units (a1), (b1), (a2), (b2), (a3) and (b3). Resin 3 had a Mw of 32,000 and a silicone content of 45.7 wt%.

Synthesis Example 4

Synthesis of Resin 4

A 3-L flask equipped with a stirrer, thermometer, nitrogen purge line and reflux condenser was charged with 42.0 g (0.10 mol) of Compound (S-1), 79.5 g (0.30 mol) of Compound (S-2), 64.5 g (0.15 mol) of Compound (S-4), 9.3 g (0.05 mol) of Compound (S-3), and 2,000 g of toluene, and heated at 70° C. Thereafter, 1.0 g of a toluene solution of chloroplatinic acid (platinum concentration 0.5 wt %) was added, and 38.8 g (0.20 mol) of Compound (S-5) and 830.1 g (0.30 mol) of Compound (S-6) wherein $y^1=38$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 4. On $^1$H-NMR spectroscopy analysis, Resin 4 was found to contain recurring units (a1), (b1), (a2), (b2), (a3), (b3), (a4) and (b4). Resin 4 had a Mw of 41,000 and a silicone content of 78.8 wt %.

Synthesis Example 5

Synthesis of Resin 5

A 3-L flask equipped with a stirrer, thermometer, nitrogen purge line and reflux condenser was charged with 53.0 g (0.20 mol) of Compound (S-2), 129.0 g (0.30 mol) of Compound (S-4), and 2,000 g of toluene, and heated at 70° C. Thereafter, 1.0 g of a toluene solution of chloroplatinic acid (platinum concentration 0.5 wt %) was added, and 38.8 g (0.20 mol) of Compound (S-5) and 830.1 g (0.30 mol) of Compound (S-6) wherein $y^1=38$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 5. On $^1$H-NMR spectroscopy analysis, Resin 5 was found to contain recurring units (a2), (b2), (a3), and (b3). Resin 5 had a Mw of 41,000 and a silicone content of 78.9 wt %.

Synthesis Example 6

Synthesis of Resin 6

A 3-L flask equipped with a stirrer, thermometer, nitrogen purge line and reflux condenser was charged with 145.7 g (0.55 mol) of Compound (S-2), 215.0 g (0.50 mol) of Compound (S-4), 9.3 g (0.05 mol) of Compound (S-3), and 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 430.5 g (0.70 mol) of Compound (S-6) wherein $y^1=8$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 6. On $^1$H-NMR spectroscopy analysis, Resin 6 was found to contain recurring units (a2), (b2), (a3), (b3), (a4) and (b4). Resin 6 had a Mw of 39,000 and a silicone content of 51.2 wt%.

Synthesis Example 7

Synthesis of Resin 7

A 3-L flask equipped with a stirrer, thermometer, nitrogen purge line and reflux condenser was charged with 79.5 g (0.30 mol) of Compound (S-2), 215.0 g (0.50 mol) of Compound (S-4), 55.8 g (0.30 mol) of Compound (S-3), and 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 123.0 g (0.20 mol) of Compound (S-6) wherein $y^1=8$ were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 7. On $^1$H-NMR spectroscopy analysis, Resin 7 was found to contain recurring units (a2), (b2), (a3), (b3), (a4) and (b4). Resin 7 had a Mw of 32,000 and a silicone content of 33.6 wt%.

[2] Preparation of Photosensitive Resin Compositions

Examples 1 to 12 and Comparative Examples 1 to 4

Photosensitive resin compositions were prepared by combining components in accordance with the formulation shown in Table 1, agitating and mixing them at room temperature until dissolution, and precision filtering through a Teflon® filter with a pore size of 1.0 μm.

TABLE 1

| Component (pbw) | | Example | | | | | | | | | | | | Comparative Example | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 | 3 | 4 |
| (A) | Resin 1 | 100 | — | — | — | — | — | — | 100 | 100 | — | — | — | — | 100 | — | — |
| | Resin 2 | — | 100 | — | — | — | — | — | — | — | — | — | — | — | — | — | — |
| | Resin 3 | — | — | 100 | — | — | — | — | — | — | — | — | — | — | — | — | — |
| | Resin 4 | — | — | — | 100 | — | — | — | — | — | 100 | 100 | 100 | 100 | — | 100 | — |
| | Resin 5 | — | — | — | — | 100 | — | — | — | — | — | — | — | — | — | — | — |
| | Resin 6 | — | — | — | — | — | 100 | — | — | — | — | — | — | — | — | — | 100 |
| | Resin 7 | — | — | — | — | — | — | 100 | — | — | — | — | — | — | — | — | — |
| (B) | PAG-1 | 1 | 1 | 1 | 1 | 1 | 1 | 1 | 1 | 1 | 1 | 1 | 1 | 1 | 1 | 1 | 1 |
| (C) | Peroxide 1 | 3 | 3 | 3 | 3 | 3 | 3 | 3 | — | — | 0.1 | 10 | 3 | — | — | — | — |
| | Peroxide 2 | — | — | — | — | — | — | — | 3 | — | — | — | — | — | — | — | — |
| | Peroxide 3 | — | — | — | — | — | — | — | — | 3 | — | — | — | — | — | — | — |
| (D) | CL-1 | 10 | 10 | 10 | 10 | 10 | 10 | 10 | 10 | 10 | 10 | 10 | 10 | 10 | 10 | 10 | 10 |
| (E) | cyclopentanone | 55 | 55 | 55 | 55 | 55 | 55 | 55 | 55 | 55 | 55 | 55 | 55 | 55 | 55 | 55 | 55 |
| (F) | AM-1 | — | — | — | — | — | — | — | — | — | — | — | 0.1 | — | — | — | — |

In Table 1, photoacid generator PAG-1, Peroxides 1 to 3, crosslinker CL-1, and quencher AM-1 are as identified below.

PAG-1

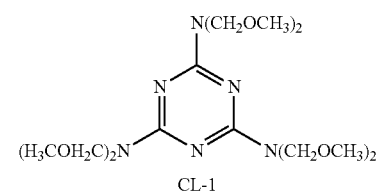

Peroxide 1: Percumyl® D (dicumyl peroxide by NOF Corp.)
Peroxide 2: Perhexa® 25B (2,5-dimethyl-2,5-di(tert-butylperoxy)hexane by NOF Corp.)
Peroxide 3: Nyper® BMT-K40 (benzoyl peroxide by NOF Corp.)

CL-1

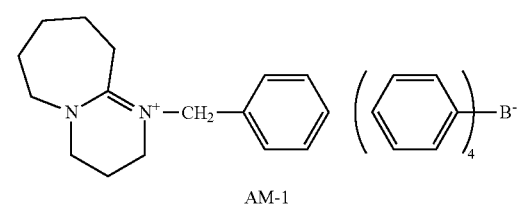

AM-1

[3] Evaluation of Resin Coating (1) Evaluation of Plastic Deformation Rate

A cured coating of each photosensitive resin composition was evaluated for plastic deformation rate as follows. Each of the photosensitive resin compositions of Examples 1 to 12 and Comparative Examples 1 to 4 was coated onto a steel plate of 13 cm by 15 cm by 0.7 mm (thick) by means of a bar coater, and baked in an oven at 190° C. for 2 hours to form a resin coating of 50 μm thick. The resin coating was cut into a strip, which was marked at intervals of 20 mm. Using a tensile tester (Shimadzu Corp.), the strip was pulled such that every distortion of 5% might take 1 hour. After load removal, a change between 20-mm spaced apart marks was examined. The sample was rated "excellent" for a percent change of less than 1%, "good" for a percent change of 1% to less than 3%, and "NG" for a percent change of more than 3%.

(2) Evaluation of Reliability (Adhesion, Crack Resistance)

Each of the photosensitive resin compositions of Examples 1 to 12 and Comparative Examples 1 to 4 was coated on a wafer by means of a spin coater and baked on a hotplate at 100° C. for 3 minutes to remove the solvent, yielding a dry film of 10 μm thick.

Using a Mask Aligner MA8 (SUSS MicroTec AG), the resin film on the wafer was exposed over its entire surface to light of wavelength 365 nm from a high-pressure mercury lamp directly, i.e., not through a mask (flood exposure). The film was PEB and dipped in PGMEA for 5 minutes. The resin film which remained after these operations was then heated in an oven at 190° C. for 1 hour, yielding a cured film.

Each film-bearing wafer was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed under an optical microscope whether or not the resin film peeled from the wafer and whether or not the resin film cracked. The sample was rated "good" when all specimens did not peel or crack, "peeled" when one or more specimens peeled, and "cracked" when one or more specimens cracked.

(3) Evaluation of Heat Resistance

Prior to a heating test, the weight of a specimen (prepared in the above reliability evaluation) was measured. The specimen was held in an oven at 200° C. for 1,000 hours, taken out of the oven, and measured for weight again. The sample was rated "good" when the weight change before and after the test was less than 0.5%, and "poor" when the weight change before and after the test was equal to or more than 0.5%.

The results are shown in Table 2.

TABLE 2

|  |  | Example |  |  |  |  |  |  |  |  |  |  |  | Comparative Example |  |  |  |
|---|---|---|---|---|---|---|---|---|---|---|---|---|---|---|---|---|---|
|  |  | 1 | 2 | 3 | 4 | 5 | 6 | 7 | 8 | 9 | 10 | 11 | 12 | 1 | 2 | 3 | 4 |
| Plastic deformation |  | Exc | Good | Good | Exc | Exc | Good | Good | Exc | Good | Good | Good | Exc | NG | NG | NG | NG |
| Reliability | Peel | Good | Good | Good | Good | Good | Good | Good | Good | Good | Good | Good | Good | Good | Good | Good | Good |
|  | Crack | Good | Good | Good | Good | Good | Good | Good | Good | Good | Good | Good | Good | Cracked | Cracked | Cracked | Cracked |
| Heat resistance |  | Good | Good | Good | Good | Good | Good | Good | Good | Good | Good | Good | Good | Poor | Poor | Poor | Poor |

Japanese Patent Application No. 2018-247071 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a silicone skeleton-containing polymer, (B) a photoacid generator, and (C) a peroxide,
wherein the silicone skeleton-containing polymer (A) comprises recurring units having the formulae (a1) to (a4) and (b1) to (b4):

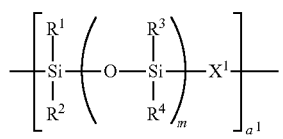
(a1)

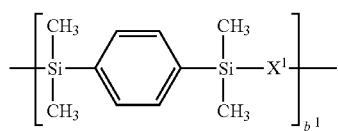
(b1)

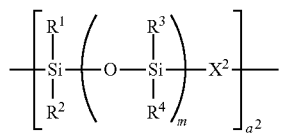
(a2)

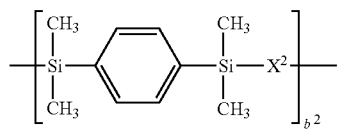
(b2)

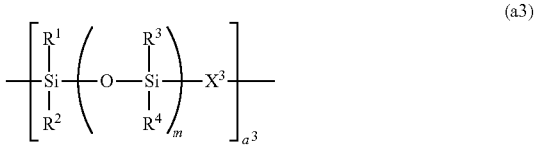
(a3)

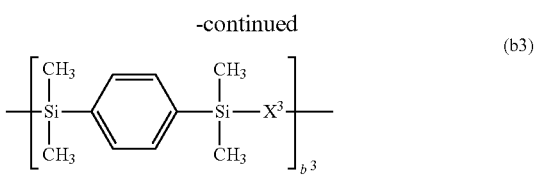
(b3)

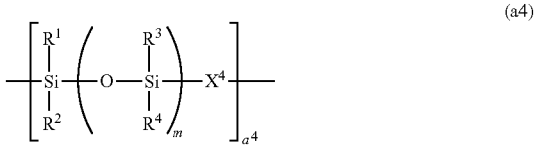
(a4)

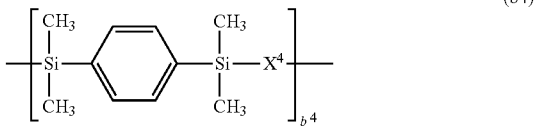
(b4)

wherein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0 \leq a^1 < 1$, $0 \leq a^2 < 1$, $0 \leq a^3 < 1$, $0 < a^4 < 1$, $0 \leq b^1 < 1$, $0 \leq b^2 < 1$, $0 \leq b^3 < 1$, $0 < b^4 < 1$, $0 < a^1 + a^2 + a^3 + a^4 < 1$, $0 < b^1 + b^2 + b^3 + b^4 < 1$, and $a^1 + a^2 + a^3 + a^4 + b^1 + b^2 + b^3 + b^4 = 1$, $X^1$ is a divalent group having the following formula (X1), $X^2$ is a divalent group having the following formula (X2), $X^3$ is a divalent group having the following formula (X3), $X^4$ is a divalent group having the following formula (X4):

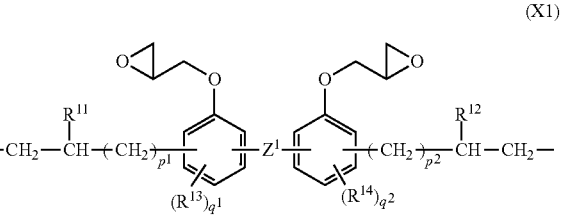
(X1)

wherein $Z^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $p^1$ and $p^2$ are each independently an integer of 0 to 7, and $q^1$ and $q^2$ are each independently an integer of 0 to 2,

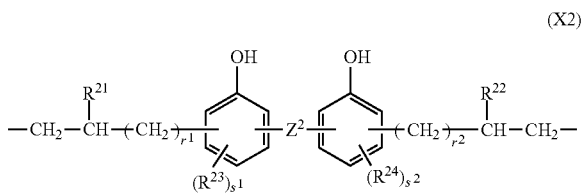

(X2)

wherein $Z^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $r^1$ and $r^2$ are each independently an integer of 0 to 7, and $s^1$ and $s^2$ are each independently an integer of 0 to 2,

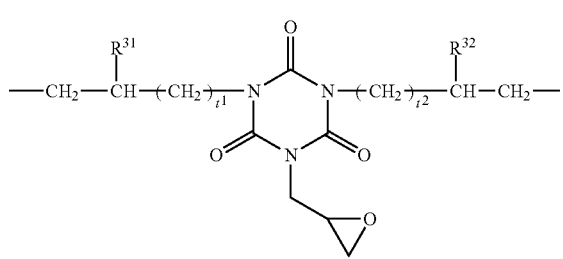

(X3)

wherein $R^{31}$ and $R^{32}$ are each independently hydrogen or methyl, and $t^1$ and $t^2$ are each independently an integer of 0 to 7,

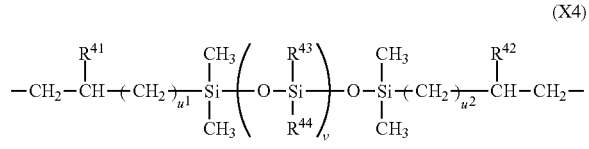

(X4)

wherein $R^{41}$ and $R^{42}$ are each independently hydrogen or methyl, $R^{43}$ and $R^{44}$ are each independently a $C_1$-$C_8$ monovalent hydrocarbon group, $u^1$ and $u^2$ are each independently an integer of 0 to 7, and v is an integer of 0 to 600, wherein the peroxide (C) is present in an amount of 0.1 to 50 parts by weight per 100 parts by weight of the silicone skeleton-containing polymer (A), the composition further comprises (D) a crosslinker; and the crosslinker (D) is present in an amount of 0.5 to 50 parts by weight per 100 parts by weight of the silicone skeleton-containing polymer (A).

2. The composition of claim 1 wherein the peroxide (C) is an organic peroxide selected from the group consisting of peroxyketal, hydroperoxide, dialkyl peroxide, diacyl peroxide, peroxy ester, and peroxy dicarbonate compounds.

3. The photosensitive resin composition of claim 1, further comprising (E) a solvent.

4. The photosensitive resin composition of claim 1, further comprising (F) a quencher.

5. The composition of claim 1 wherein the peroxide (C) is present in an amount of 1 to 20 parts by weight per 100 parts by weight of the silicone skeleton containing polymer (A).

6. The composition of claim 1 wherein the peroxide (C) is peroxyketal or peroxy ester.

7. A laminate comprising a substrate having grooves and/or holes having an opening width of 10 to 100 μm and a depth of 10 to 120 μm and a photosensitive resin coating formed thereon from the photosensitive resin composition of claim 1.

8. A pattern forming process comprising the steps of:
   (i) applying the photosensitive resin composition of claim 1 to form a photosensitive resin coating on a substrate,
   (ii) exposing the photosensitive resin coating to radiation, and
   (iii) developing the exposed resin coating in a developer.

9. The pattern forming process of claim 8, further comprising (iv) post-curing the patterned resin coating resulting from development step (iii) at a temperature of 100 to 250° C.

10. The pattern forming process of claim 8 wherein the substrate has grooves and/or holes having an opening width of 10 to 100 μm and a depth of 10 to 120 μm.

* * * * *